United States Patent [19]
Kon et al.

[11] Patent Number: 4,688,098
[45] Date of Patent: Aug. 18, 1987

[54] SOLID STATE IMAGE SENSOR WITH MEANS FOR REMOVING EXCESS PHOTOCHARGES

[75] Inventors: Takao Kon, Tokyo; Kensaku Yano, Yokohama; Masayuki Kakegawa, Chigasaki; Hidenori Shibata, Tokyo, all of Japan

[73] Assignee: Kabushiki Kaisha Toshiba, Kawasaki, Japan

[21] Appl. No.: 813,466

[22] Filed: Dec. 24, 1985

[30] Foreign Application Priority Data

| Dec. 24, 1984 | [JP] | Japan | 59-270688 |
| May 27, 1985 | [JP] | Japan | 60-112115 |
| Jun. 6, 1985 | [JP] | Japan | 60-121406 |
| Oct. 11, 1985 | [JP] | Japan | 60-224655 |

[51] Int. Cl.$^4$ .............................................. H04N 3/14
[52] U.S. Cl. .......................... 358/213.19; 358/213.31; 357/30
[58] Field of Search .............................. 358/212, 213; 357/24 LR, 30

[56] References Cited

U.S. PATENT DOCUMENTS

| 4,236,829 | 12/1980 | Chikamura et al. | 357/30 |
| 4,323,912 | 4/1982 | Koike et al. | 357/30 |
| 4,453,184 | 6/1984 | Hamakawa et al. | 358/213 |
| 4,499,384 | 2/1985 | Segawa et al. | 358/213 |
| 4,521,798 | 6/1985 | Baker | 357/30 |
| 4,543,489 | 9/1985 | Harada et al. | 358/213 |

FOREIGN PATENT DOCUMENTS

| 56-146375 | 11/1981 | Japan . |
| 58-17784 | 2/1983 | Japan . |
| 58-46773 | 3/1983 | Japan . |
| 58-80975 | 5/1983 | Japan . |

OTHER PUBLICATIONS

Japanese Journal of Applied Physics, Supplements, 1983, 15th Conference, pp. 209-212, Tokyo, JP; N. Harada et al., "A CCD Image Sensor Overlaid with an a-Si:H/a-SiC:H Photoconversion Layer".

Primary Examiner—Gene Z. Rubinson
Assistant Examiner—Stephen Brinich
Attorney, Agent, or Firm—Cushman, Darby & Cushman

[57] ABSTRACT

In a solid state image sensor, first electrodes corresponding to pixels are arranged in a predetermined interval on a CCD structure. The first electrodes are electrically connected to storage sections of the CCD structure and electrically insulated from a transferring section of the CCD structure. Second electrodes are arranged in a predetermined interval on a flat surface of an insulating layer formed on the first electrodes and are electrically connected to the first electrodes. A photoconductive film for converting incident light rays to charges is formed on the second electrodes. A third electrode is formed on the photoconductive film through a barrier layer. Fourth electrodes which are electrically connected to the photoconductive film and electrically insulated from the second electrodes are barried in the insulating layer. An external voltage is applied to the fourth electrode.

14 Claims, 10 Drawing Figures

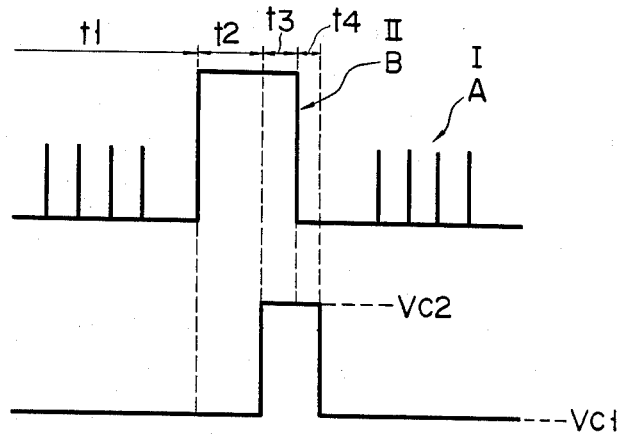
FIG. 5A
FIG. 5B
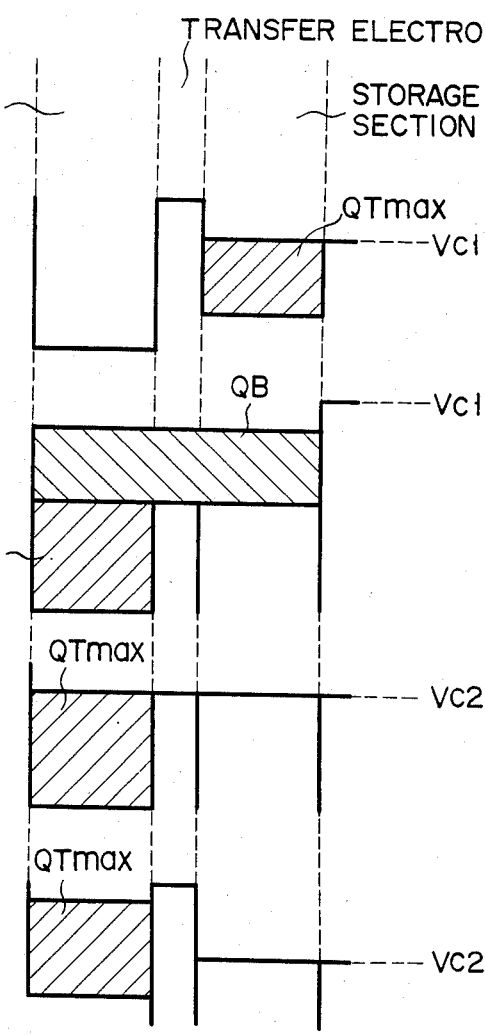
FIG. 6A
FIG. 6B
FIG. 6C
FIG. 6D

SOLID STATE IMAGE SENSOR WITH MEANS FOR REMOVING EXCESS PHOTOCHARGES

BACKGROUND OF THE INVENTION

The present invention relates to a solid state image sensor and, more particularly, to a solid state image sensor of a stacking type wherein a storage section and a transferring section are formed on a semiconductor substrate and a photo conductive film or layer is formed on the storage and transferring sections through an insulating layer.

A conventional solid state image sensor with a photo conductive film stacked thereon has good characteristics such as high sensitivity and low smear since light rays are photoelectrically converted by the photo conductive film. A solid image sensor of this type can be utilized in a variety of applications for TV cameras such as monitor TV cameras and has been developed as a solid state sensor of the next generation.

In a typical example of an image sensor, a photoelectric conversion section and a transparent electrode are sequentially formed on a substrate with a semiconductor device for transferring an electric charge. More specifically, the semiconductor device is formed on the substrate to transfer the charge, pixel electrodes connected to a diode region divided for every pixel or picture element are formed on the semiconductor substrate, a photoelectric conversion section is formed on the pixel electrodes, and a transparent electrode is formed on the photoelectric conversion section. The photoelectric conversion section blocks the injection of electrons therefrom, thereby constituting a multilayer structure with a barrier layer for providing a low dark current and small image lag. For example, when an i-type hydrogenated amorphous silicon is used to form a photoelectric film, p-type hydrogenated amorphous silicon carbide is often used as the barrier layer, thereby constituting an i-p structure. In order to smoothen the surface on which the photoelectric transducer section is formed, an insulating film can be formed on the surface of the semiconductor substrate.

In a conventional solid state image sensor of the type described above, blooming is a major problem. When a strong beam spot is formed on the image sensor, a reproduction region on the reproduction screen of a display apparatus vertically extends to greatly degrade image quality.

The primary cause for blooming is as follows. Incident light rays pass through a gap between pixel electrodes, become incident on the semiconductor substrate and are converted into carriers therein. The converted carriers are diffused into the transferring section and are mixed with the other carriers stored in the transferring section. In general, the total area of gaps between pixel electrodes is 30% of the total light reception area, so that blooming cannot be neglected. According to another cause for blooming, a charge storage capacity is several times the maximum vertical transfer charge. When strong light rays are incident on the image sensor, the generated signal charge is excessively large and overflows in the vertical transferring section.

A technique for preventing blooming described above is described in Japanese Patent Disclosure No. 55-104176. According to this prior art, an image sensor has a light-shielding section for shielding light at the gaps between pixel electrodes. However, it is apparent that blooming caused by transfer capacity cannot be prevented by only the provision of the light-shielding section. According to another conventional technique for preventing blooming, a voltage is applied to a transparent electrode to remove excessive charge to the transparent electrode. However, since there is a barrier layer under the transparent electrode for preventing injection of external charge, the amount of charge removed to the transparent electrode side is very small, and good blooming reduction effect cannot be expected. Furthermore, since the voltage is applied to the transparent electrode, a voltage actually applied to the photo conductive film is decreased. As a result, an image lag is formed and after image occurs.

According to still another technique for preventing blooming, an electrode connected to a photo conductive film is formed in a portion excluding the pixel area. An external voltage is applied to the electrode to remove the charge from the photo conductive film. Image sensors with a charge control electrode are described in Japanese Patent Disclosure Nos. 58-17784 and 58-80975. In the image sensor described in Japanese Patent Disclosure No. 58-17784, a charge control electrode is formed between the pixel electrodes to improve resolution. With this structure, blooming caused by light rays passing through a gap between the pixel electrode and the charge control electrode and incident on the semiconducor substrate cannot be sufficiently prevented. When packing density of pixels is increased, a pixel electrode width is decreased to about 1 $\mu$m. It is thus difficult to form a charge control electrode in this electrode portion. In the image sensor described in Japanese Patent Disclosure No. 55-80975, a charge control electrode is arranged in a photoelectric conversion section. However, light shielding for the light rays incident on the semiconductor substrate is not sufficient as in the conventional image sensors described above, and blooming cannot be completely prevented. Furthermore, the process for forming an electrode in the photoelectric transducer section is complicated. As a result, the breakdown voltage at the photoelectric transducer section is decreased and may cause damage thereto.

SUMMARY OF THE INVENTION

It is an object of the present invention to provide a solid state image sensor with functions for adjusting an amount of charge in a photo conductive film and restricting light rays reaching a semiconductor substrate.

According to the present invention, there is provided a solid state image sensor comprising:

a semiconductor substrate having a large number of storage sections corresponding to pixels for storing charges and a transfer section for transferring the charges;

first electrodes of which each has one end connected to a corresponding storage section, which are electrically insulated from the transferring section, the first electrodes being arranged in a predetermined interval to extend above the semiconductor substrate;

a first insulating layer formed on the first electrode and which has a flat surface;

second electrodes formed on a surface of the insulating layer at predetermined intervals and electrically connected to the first electrodes;

a photo conductive film, formed on the second electrodes, for converting light rays incident thereon to a charge;

a barrier layer formed on the photo conductive film to form a barrier for the photo conductive film;

a light-transmitting third electrode formed on the barrier layer; and fourth electrodes located opposite the second electrodes and in ohmic contact with the photo conductive film, an external voltage being applied to the fourth electrodes.

BRIEF DESCRIPTION OF THE DRAWINGS

FIGS. 5A and 5B are timing charts of pulses applied to a transfer electrode and the fourth electrode in the image sensor of FIG. 3; and FIGS. 6A to 6D are timing charts for explaining changes in potentials at a charge storage section and a transferring section in the image sensor of FIG. 3.

DETAILED DESCRIPTION OF THE PREFERRED EMBODIMENTS

Figure 1:
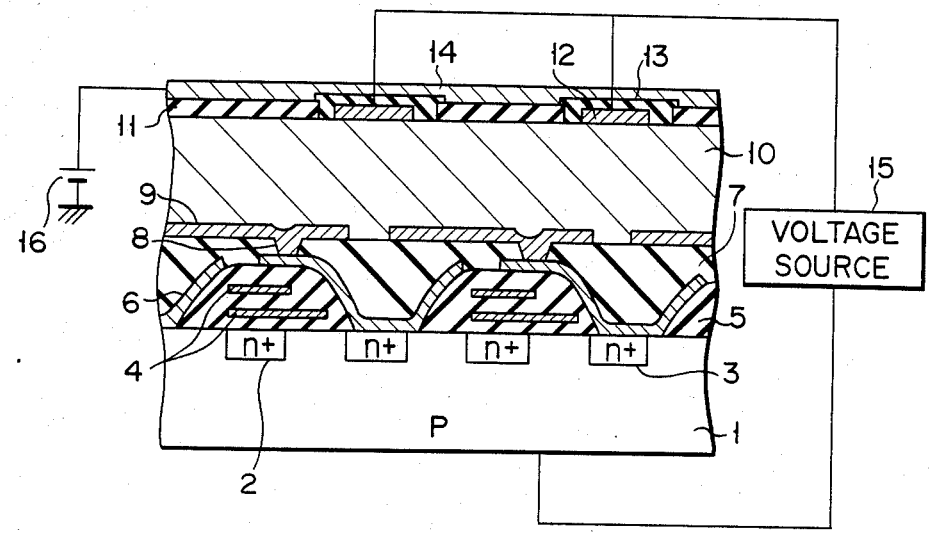
FIG. 1 is a schematic sectional view of an image sensor according to an embodiment of the present invention.

FIG. 1 is a schematic sectional view of a solid state image sensor according to an embodiment of the present invention. The structure of the solid state image sensor shown in FIG. 1 will be described with reference to its fabrication process. In this image sensor, an $n^+$-type impurity is diffused in one major surface of a p-type silicon substrate to form vertical CCD registers of $n^+$-type buried channel CCDs, that is, vertical transferring sections 2 and charge storage diodes of p-n junctions, that is, storage sections 3. Insulating layer 5 is formed on substrate 1 except for the $n^+$-type regions of diodes 3. Transfer electrodes 4 insulated by layer 5 are embedded in layer 5 above the $n^+$-type regions of registers 2, thereby constituting storage and transferring sections on substrate 1. With this structure, when a predetermined external pulse is applied to transfer electrode 4, charges are transferred from diodes 3 to registers 2. Registers 2 sequentially transfer the charges toward a horizontal transferring section (not shown) along one direction.

First electrodes 6 representing pixels and made of, e.g., aluminum are formed on film 5 so as to electrically contact diodes 3, i.e., $n^+$-type regions of the storage section. Insulating layer 7 of polyimide is formed on electrodes 6 to flatten the surface of substrate 1. Contact holes 8 are formed in flat layer 7, and second electrodes 9 as pixel electrodes of, e.g., aluminum were formed on layer 7 and are electrically connected to corresponding first electrodes 6 through corresponding holes 8. Photo conductive film 10 (e.g., i-type hydrogenated amorphous silicon) and barrier layer 11 (e.g., p-type hydrogenated amorphous silicon carbide) are sequentially formed on electrodes 9. Layer 11 is not formed on portions of film 10 which correspond to regions between electrodes 9, so that layer 11 is selectively formed on film 10. Fourth electrodes 12 of, e.g., aluminum are formed in ohmic contact with the regions of film 10 which do not have barrier layer 10 thereon. Insulating film 13 is formed to cover electrodes 12, so that fourth electrode 12 is electrically insulated from third electrode 14 through layer 13. Light-transmitting third electrode 14 of e.g, ITO (indium tin oxide) is formed on layers 11 and 13. Each electrode 12 has a width larger than a gap between second electrodes 9. Electrodes 12 and 14 are connected to external voltage sources 15 and 16, respectively. A bias voltage from voltage source 15 is supplied to fourth electrodes 12, and a bias voltage from voltage source 16 is supplied to electrode 14.

The operation of the solid state image sensor with the arrangement described above will be described hereinafter. A charge readout pulse voltage is supplied to electrode 4. A potential at the second electrode is maximum (e.g., 7 V) immediately after the charge signal is transferred from the storage section to the charge transferring section. When the second electrode is set at the maximum potential, a signal charge generated by film 10 is attracted to electrode 9, and the potential at electrode 9 is decreased. For example, when light rays with a high intensity are incident on the sensor the potential at electrode 9 is decreased to as low as about 1 V, which is equal to that at electrode 14. In the embodiment shown in FIG. 1, when an excessive charge is generated in film 10, a threshold voltage, e.g., 3 V is supplied from source 15 so as to set electrode 12 at the threshold potential (3 V) of electrode 9. When strong light rays are incident on the sensor, a lateral resistance in film 10 is decreased, and the generated charge can easily flow in electrode 12. The potential at electrode 9 is set to be substantially equal to that at the fourth electrode and will not decrease. Therefore, the excessive charge is removed from film 10, and the charge amount to be storaged by film 10 and the storage section is determined by the voltage supplied to electrode 12. The excessive charge which cannot be transferred to the vertical CCD is trapped or absorbed by the fourth electrode, thereby reducing blooming. Since electrode 14 is in ohmic contact with film 10, application of a voltage (e.g., $-1$ V) lower than the voltage at electrode 14 to electrode 12 allows charge injection from electrode 12 to film 10. In an application of image sensors to monitor TVs with a low illuminance, the injected charge serves as a bias charge, thus greatly improving image lag in a low-illuminance image, which is a significant problem in a dark place.

Furthermore, since electrode 12 has a width larger than the gap between electrodes 9, light reaching substrate 1 can be shielded, so that blooming caused by this light component can be reduced.

Figure 2:
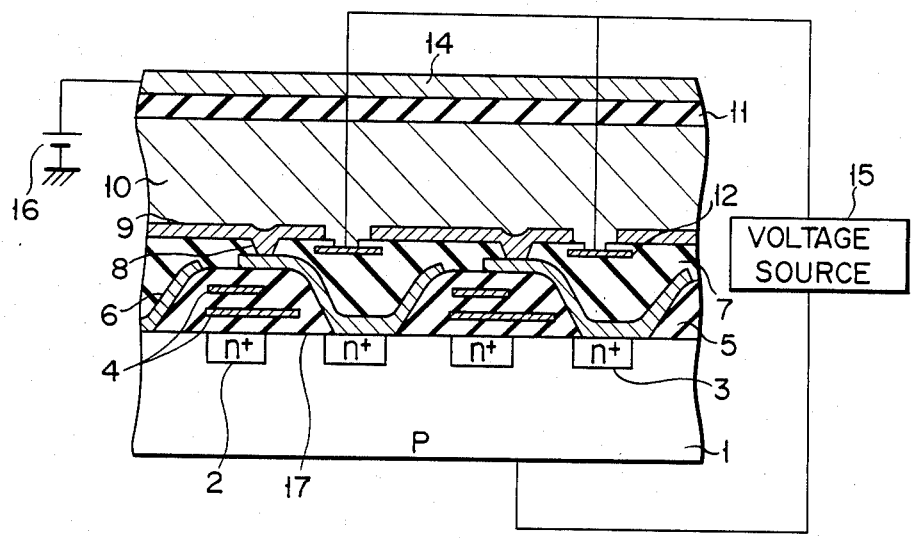
FIG. 2 is a schematic sectional view of an image sensor according to another embodiment of the present invention.

FIG. 2 shows another embodiment of the present invention. The same reference numerals as in FIG. 2 denote the same parts as in FIG. 1. The image sensor of the embodiment in FIG. 2 is substantially the same as that in FIG. 1, except that the shape of barrier layer 11 and the position of fourth electrode 12 are different from those of FIG. 1. The structure of the image sensor of the embodiment in FIG. 2 will be described with reference to its fabrication process. The steps up to formation of first electrodes 6 in the embodiment of FIG. 2 are the same as those of FIG. 1, so that only the subsequent steps will be described. Insulating layer 7 of, e.g., polyimide is formed on first electrodes 6 to flaten the surface. Layer 7 is formed by two steps. In the first step, a portion of layer 7 is formed, and the surface of layer 7 on substrate 1 flatened, and then fourth electrodes 12 made of a non-transparent material such as aluminum are formed on the flat surface of substrate 1. In the second step, another portion of layer 7 is further deposited to bury electrodes 12. It should be noted that electrodes 12 are formed corresponding to gaps between electrodes 9 and each electrode 12 has a width larger than that of the corresponding gap. Electrodes 12 are connected to external power source 15 to receive a bias voltage therefrom. Contact holes 8 are formed in layer 7, and second electrodes 9 of a nontransparent material such as aluminum are formed on layer 7 at predetermined intervals, so that electrodes 9 are electrically connected to electrodes 6 through corresponding contact holes 8. As shown in FIG. 2, parts of layer 7 on electrodes 12 are removed, and only ends of electrodes 12 are buried in layer 7. Photo conductive film 10 of, e.g., i-type hydrogenated amorphous silicon is formed on electrodes 9 and the exposed portions of electrodes 12. Electrodes 12 are in ohmic contact with film 10. Barrier layer 11 of, e.g., p-type hydrogenated amorphous silicon carbide is formed on film 10, and light-transmitting third electrode 14 of, e.g., ITO is formed on layer 11. As a result, a desired solid state image sensor can be fabricated.

In the embodiment shown in FIG. 2, the same effect as in the embodiment of FIG. 1 can be obtained. In addition, since electrode 12 is made of a nontransparent material and overlaps electrode 9, light rays are not substantially incident on the substrate 1, thereby improving antiblooming capability.

In the above two embodiments, when a charge signal is constituted by electrons, a voltage higher than that at electrode 9 upon generation of an excessive charge in film 10 is supplied to electrode 12. The excessive charge is flowed out of the sensor through electrode 12. When a voltage lower than that at the transparent electrode is supplied to electrode 12, the charge is injected from electrode 12, thereby preventing the image lag at low illuminances. However, when an incident light intensity is often abruptly changed upon application of a constant voltage, the image sensor may not be properly operated under given circumstances.

Figure 3:
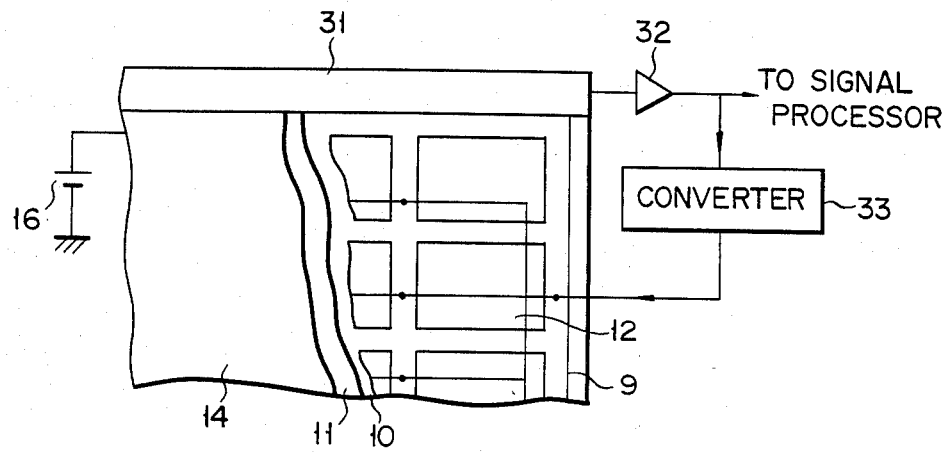
FIG. 3 is a plan view of an image sensor with a circuit for applying to a fourth electrode a voltage obtained from the image sensor of FIG. 2 in accordance with an output signal level of a pixel of the image sensor of FIG. 2.
Figure 4:
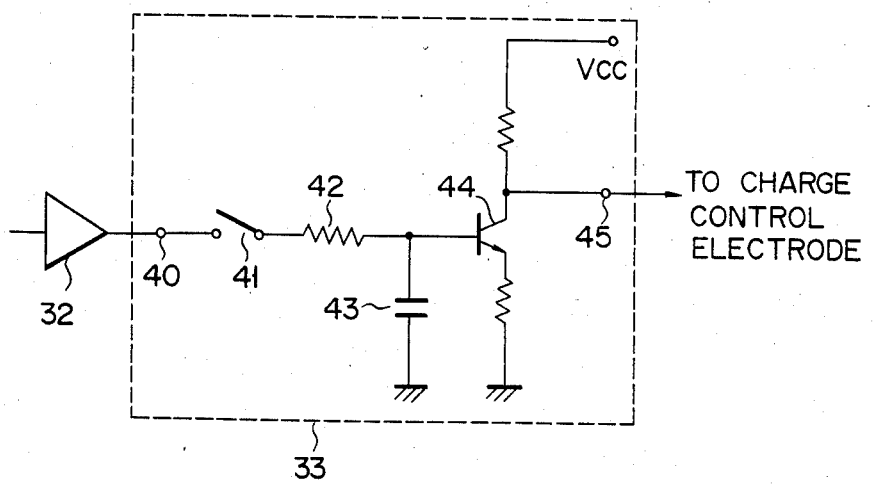
FIG. 4 is a circuit diagram of a signal voltage converter for converting the output signal from the pixel in the image sensor of FIG. 3 to a voltage signal.

A technique for properly driving the image sensor even under such circumstances will be described with reference to the embodiment of FIG. 2. As soon as the readout pulse voltage is supplied to electrode 4 in FIG. 2, potentials at diodes 3 and electrodes 6 and 9 are set at channel potential Vch at gate 17. In this state, since electron-hole pairs produced in film 10 upon reception of light rays migrate toward electrode 9 or 14. The potential at electrode 9 is decreased. When a predetermined storing period has elapsed, the potential at electrode 9 is decreased to potential Vs corresponding to an incident light intensity, and the charge is transferred to CCD 2 at a rate corresponding to a difference between the channel potential and the potential at electrode 9. The signal charge from the pixel to CCD 2 is transferred to horizontal charge transferring section 31 of FIG. 3 through vertical charge transferring section 2 of FIG. 2, and the transferred charge is generated as a time-serial signal by output amplifier 32. The output signal is separated into two components. One component appears as a video signal through an external signal processor. The other component is converted by signal-voltage converter 33 to a voltage corresponding to the input signal level. The converted voltage is supplied to electrode 12. FIG. 4 is a circuit diagram of signal-voltage converter 33 for generating a low output signal voltage when the intensity level of light incident on the image sensor comes near the black level. Converter 33 has a circuit for integrating a one-field output signal from the image sensor and converting it to a voltage. In this circuit, a signal from amplifier 32 is supplied from terminal 40 to a low-pass filter of resistor 42 and capacitor 43 through switch 41 synchronized with the vertical sync signal. The signal is integrated by the low-pass filter and converted to a signal including a DC component. The signal from the low-pass filter is amplified by transistor 44, so that the voltage to be applied to electrode 12 appears at terminal 45.

In the embodiment shown in FIG. 4, when strong light rays are incident on the image sensor, an output signal is increased and an output voltage from the output amplifier 32 is decreased to decrease a voltage to the base of transistor 44 and increase a collector voltage. Voltage Vcd supplied to electrode 12 is increased. After potential Vs at electrode 9 which is decreased in accordance with the light intensity level becomes equal to voltage Vcd, the excessive charge generated by film 10 is discharged from the electrode 12, thereby reducing blooming. When the image sensor is irradiated with light at a low illuminance, an output voltage from transistor 44 is decreased even if the output signal is small. At the same time, voltage Vcd supplied to electrode 12 is decreased. When voltage Vcd supplied to electrode 12 is lower than voltage Vtd at electrode 14, the charge is injected from electrode 12 to film 10, so that the image lag can be improved. In this embodiment, the voltage obtained by converting the average value of the one-field output signal is supplied to electrode 12. However, the voltage supplied to electrode 12 can be a voltage obtained by converting a peak value of the one-field output signal. Furthermore, in the above embodiment, the signal from amplifier 32 is converted to the voltage supplied to electrode 12. However, the video signal processed by the signal processor can be converted to a voltage applied to electrode 12.

The following problem may occur when a constant voltage is supplied to electrode 12. The potential at the storage section is higher than that at electrode 12 during a period for transferring the signal charge from the storage section to the charge transferring section. The charge generated upon radiation of high light during this period cannot flow to electrode 12 but is accumulated in the charge transferring section or the storage section. As a result, the charge generated by high light during which the signal charge is read out from the storage section and transferred to the charge storage section is stored in the charge transferring section or the storage section, thus causing blooming or a highlighted image lag.

A technique for solving the above problem will be described with reference to FIGS. 5 and 6 using the solid state image sensor in FIG. 2. The following technique is exemplified by the solid state image senosr of FIG. 2 and can be applied to a CCD structure. When a scanning section simply corresponds to the vertical CCD in the following description. FIG. 5A shows timings and waveforms of pulses supplied to electrode 4. FIG. 5B shows timings and waveforms of pulses supplied to electrode 12. FIGS. 6A, 6B, 6C and 6D show changes in potentials at the storage section and the vertical CCD, i.e., at the charge transferring section and under electrode 4 during time intervals t1 and t4 in FIGS. 5A and 5B.

Referring to FIG. 5A, referfence symbol I denotes transfer pulses; and II, signal readout pulses. The signal charge is read out from the storage section to the charge transferring section for intervals t2. As is apparent from FIG. 5B, a pulse voltage corresponding to pulse II is supplied to electrode 12. Voltage Vc1 (e.g., 2 V) corresponding to a voltage at the storage section to which a maximum amount of charge is stored, is normally supplied to electrode 12. For time intervals t3 and t4, voltage Vc2 (e.g., 4 V) corresponding to the voltage at the storage section which can not stored the signal charge is supplied to electrode 12.

Assume that strong light rays are incident on film 10 for photoelectrically converting light rays to an electrical signal in the solid state image sensor in FIG. 2. During interval t1, the signal charge generated by film 10 upon radiation of light rays is stored by diodes 3, i.e., the storage section. In this case, voltage Vc1 is supplied to electrode 12 electrically connected to film 10, as shown in FIG. 6A. The potential at the storage section is kept at potential Vc1 even if strong light rays are incident on the image sensor, so that maximum charge Qtmax to be transferred to the charge transferring section is stored in the storage section. During interval t2 (e.g., 25 μsec), pulse II rises, and then charge Qtmax is transferred to the charge transferring section. Then the potential at the storage section becomes higher than voltage Vc1. So charge Qb generated by the excessive light rays during interval t2 are stored in the storage section and cannot be transferred to the transferring section as shown in FIG. 6B. When voltage Vc2 is supplied to electrode 12 for interval t3 (e.g., 25 μsec), charge Qb flows out of the storage section through electrode 12 which is set at a potential higher than that of charge Qb, as shown in FIG. 6C. The potential at the storage section is set at Vc2, so that charge Qtmax is left in the charge transferring section. As shown in FIG. 5A, when pulse II falls during interval t4 (e.g., 25 μsec), transfer of charge Qtmax is started, as shown in FIG. 6D.

According to the technique for driving the image sensor, as shown in FIGS. 5A and 5B and FIGS. 6A to 6D, when the pulse voltage corresponding to the readout pulse is supplied to electrode 12, the amount of signal charge stored in the storage section can be controlled to a possible transfer range for the charge transferring section. The excessive charge generated for a read period of the charge from the storage section to the charge transferring section can also be removed. As a result, blooming caused by overflow of an excessive charge in the charge transferring section and the highlight image lag caused by residual charge in the storage section can be prevented.

Electrodes 12 may be formed at both positions shown in FIGS. 1 and 2. With this arrangement, i.e., by providing a difference between voltages supplied to two types of electrodes 12, the excessive charge in film 10 can be easily removed or injected. The above description exemplifies that the charge associated with imaging operation is mainly constituted by electrons. However, the present invention can also be applied to a case wherein holes constitute a charge associated with imaging. Furthermore, hydrogenated amorphous silicon is used to form film 10. However, the material for film 10 is not limited to this, but can be extended to $Sb_2S_2$, Se-As-Te, CdSe or CdZnTe used as a photoelectric material for image pickup tubes. Alternatively, an infrared photoelectric material such as InSb, PbSnTe or CdHgHe can be also be used. The scanning section is exemplified by an interline transfer type CCD, but is not limited thereto. A MOS type CCD, a BBD or a combination thereof may be utilized.

According to the solid state image sensor of the present invention, the charge control electrode is formed correspnding to the gap between the pixel electrodes, and the amount of charge in the photo conductive film can be freely controlled. Therefore, blooming or the highlight image lag can be prevented. At the same time, an image lag at low illuminances can also be prevented.

What is claimed is:

1. A solid state image sensor having electrodes for controlling signal charges comprising:
   a semiconductor structure having storage sections corresponding to pixels for storing charges and a transferring section for transferring the charges from said storage sections and converting the charges to an image output signal;
   first electrodes each having one end connected to a corresponding storage section, said first electrodes being electrically insulated from said transferring section, and arranged at predetermined intervals to extend above said semiconductor substrate;
   a first insulating layer formed on said first electrodes said insulating layer having a flat surface;
   second electrodes formed on a surface of said first insulating layer at predetermined intervals and electrically connected to said first electrodes;
   a photoconductive film formed on said second electrodes;
   a barrier layer formed on said photoconductive film to form a barrier for said photo conductive film;
   a light-transmitting third electrodes formed on said barrier layer; and
   fourth electrodes formed on said photoconductive film and electrically insulated from said barrier layer and said third electrode said fourth electrodes being in ohmic contact with said photoconductive film and adapted to receive an external voltage applied thereto.

2. A sensor according to claim 1, wherein each of said fourth electrodes has a width larger than a gap between said second electrodes.

3. A sensor according to claim 1, wherein said fourth electrodes are formed on said photoconductive film, said sensor further including a second insulating layer formed between said fourth electrode and said barrier layer and between said fourth electrode and said third electrode.

4. A sensor according to claim 1, further comprising means for applying a voltage to each of said fourth electrodes.

5. A sensor according to claim 4, wherein said voltage applying means generates a voltage signal depending on the image output signal.

6. A sensor according to claim 1, wherein said semiconductor structure comprises a semiconductor substrate, a large number of first and second impurity regions formed in said semiconductor substrate, a third insulating layer formed on said semiconductor substrate, and transfer electrodes buried in said third insulating layer so as to receive transfer voltage pulses, said first electrodes being in contact with said first impurity region, said storage sections being defined by said first impurity regions and said semiconductor substrate, said transferring section being defined by said second impurity regions, said transfer electrodes and said semiconductor substrate.

7. A sensor according to claim 6, further comprising means for applying a voltage to each of said fourth electrodes, said voltage applying means being adapted to generate a pulse voltage corresponding to the readout voltage pulse to be supplied to said transfer electrodes.

8. A sensor according to claim 1, wherein said fourth electrodes are made of a non-transparent material.

9. A solid state image sensor with a photoconductive film having electrodes for controlling signal charges comprising:

a semiconductor structure having storage sections corresponding to pixels for storing charges and a transferring section for transferring the charges from said storage sections and converting the charges to output signals;

first electrodes each having one end connected to a corresponding storage section, said first electrodes being electrically insulated from said transferring section and arranged at predetermined intervals to extend above said semiconductor substrate;

a first insulating layer formed on said first electrodes which insulating layer has a flat surface;

second electrodes formed on a surface of said first insulating layer at predetermined intervals and electrically connected to said first electrodes;

a photoconductive film formed on said second electrodes;

a barrier layer formed on said photoconductive film to form a barrier for said photoconductive film;

a light-transmitting third electrode formed on said barrier layer; and fourth electrodes buried in said first insulating layer under said second electrodes and which are in ohmic contact with said photoconductive film, each of said fourth electrodes being spaced apart from each other and adapted to receive an external voltage applied thereto.

10. A sensor according to claim 9, wherein each of said fourth electrodes has a width larger than a gap between said second electrodes.

11. A sensor according to claim 9, further comprising means for applying a voltage to each of said fourth electrodes.

12. A sensor according to claim 11, wherein said voltage applying means generates a voltage signal depending on the image output signal.

13. A sensor according to claim 9, wherein said semiconductor structure comprises a semiconductor substrate, a large number of first and second impurity regions formed in said semiconductor substrate, a second insulating layer formed on said semiconductor substrate, and transfer electrodes buried in said second insulating layer so as to receive transfer voltage pulses, said first electrodes being in contact with said first impurity region, said storage sections being defined by said first impurity regions and said semiconductor substrate, said transferring section being defined by said second impurity regions, and transfer electrodes and said semiconductor substrate.

14. A sensor according to claim 13, further comprising means for applying a voltage to each of said fourth electrodes, said voltage applying means being adapted to generate a pulse voltage corresponding to the readout voltage pulse to be supplied to said transfer electrodes.

* * * * *